United States Patent [19]
Wong

[11] Patent Number: 5,297,089
[45] Date of Patent: Mar. 22, 1994

[54] BALANCED BIT LINE PULL UP CIRCUITRY FOR RANDOM ACCESS MEMORIES

[75] Inventor: Robert C. Wong, Poughkeepsie, N.Y.

[73] Assignee: International Business Machines Corporation, Armonk, N.Y.

[21] Appl. No.: 842,673

[22] Filed: Feb. 27, 1992

[51] Int. Cl.$^5$ .................. G11C 7/00; G11C 11/40
[52] U.S. Cl. .................. 365/202; 365/174; 365/230.06; 365/189.01
[58] Field of Search .......... 365/174, 189.01, 154, 365/202, 207, 228, 230.06; 307/530

[56] References Cited

U.S. PATENT DOCUMENTS

| | | | |
|---|---|---|---|
| 3,789,243 | 1/1974 | Donofrio et al. | 307/530 |
| 4,158,237 | 6/1979 | Wiedmann | 365/154 |
| 4,302,823 | 11/1981 | Gersbach et al. | 365/190 |
| 4,455,625 | 6/1984 | Denis et al. | 365/154 |
| 4,555,776 | 11/1985 | Masenas, Jr. | 365/202 |
| 4,760,561 | 7/1988 | Yamamoto et al. | 365/190 |
| 4,780,850 | 10/1988 | Miyamoto et al. | 365/189.09 |
| 4,813,017 | 3/1989 | Wong | 365/156 |
| 5,070,482 | 12/1991 | Miyaji | 365/230.06 |
| 5,121,357 | 6/1992 | Wiedmann et al. | 365/203 |

OTHER PUBLICATIONS

Marcello, et al., "Bit Current Steering Network" IBM Technical Disclosure Bulletin, vol. 24, No. 1B (Jun. 1981).

Primary Examiner—Eugene R. LaRoche
Assistant Examiner—Andrew Tran
Attorney, Agent, or Firm—Joseph J. Kaliko; Charles W. Peterson, Jr.

[57] ABSTRACT

A balancing circuit which may be used as part of a random access memory system for eliminating bit line offset, is disclosed. The balancing circuit contemplated by the invention is capable of supporting rapid memory accesses (such as reads when the memory enters a "read" mode); and simultaneously minimizes the potential for the disturbance of data stored in the memory cells attached to a given bit line pair when the memory is in a "standby" mode following deselect. The invention is particularly useful in connection with the Harper/PNP memory cell arrays.

10 Claims, 3 Drawing Sheets

BALANCED BIT LINE PULL UP CIRCUITRY FOR RANDOM ACCESS MEMORIES

FIELD OF THE INVENTION

The invention relates generally to random access memory arrays and to bit line driver circuits used to provide access to the memory cells in such arrays. More particularly, the invention relates to bit line pair balancing circuitry, included in a bit line driver circuit, for eliminating bit line offset when the driver circuitry is attached, for example, to a column of memory cells. The balancing circuitry contemplated by the invention achieves a rapid memory cell access capability when the memory is in a "read" or "write" mode; and minimizes the potential for the disturbance of data stored in the column of cells when the memory column is in a "standby" mode following deselect. The invention is particularly useful in connection with Harper/PNP memory cell arrays.

DESCRIPTION OF THE RELATED ART

In known random access memories, such as those used in the commercially available IBM System 3090 ("IBM" is registered trademark of the International Business Machines Corporation), saturated Harper/PNP memory cell arrays are always coupled to the bit lines. In such systems the standby bit line currents (i.e., currents on the bit lines after the memory has been deselected and is in a standby mode), are sensitive functions of the bit pattern along the column. In the worst case where all cells are "turned-on" (e.g., storing data) on the same side, the bit line current feeding all the cell back injections can exceed the regular standby pull down current by a factor of ten.

In the present IBM 3090 design, a pair of emitter followers are used to provide the varying bit line currents and to set the standby bit line voltage levels. To save power, the bit line standby current is set to under 100 ua, while the memory cell back injection current can reach 1 ma if 128 or more cells are loaded on the bit lines.

Thus, the voltage levels of the two sides of the bit line pair, to which a column of memory cells are attached, can differ by over 100 mv because of the difference in $V_{be}$'s and the IR drop through the emitter resistance of the pull up transistors (the emitter follower pair).

This large bit line voltage offset severely limits memory array performance and the possible extension of bit line loading for redundancy or for higher density applications.

For the exemplary IBM system 3090 discussed hereinabove, the offset can be reduced if bit line standby current is increased over ten times or if the pull up emitter followers are made extremely large. However, power and area limitations, in addition to the problems associated with such increases in power and/or area, make such designs impractical.

The general state of the prior art with respect to solving the aforementioned problems (back injection, offset reduction, etc., while keeping practical power and area limitations in mind), may be best illustrated and understood with reference to several publications and patents to be described immediately hereinafter.

An article by Marcello et al, entitled "Bit Current Steering Network" published in June 1981 in IBM Technical Disclosure Bulletin Volume 24, No. 1B, teaches the general concept of utilizing a steering network for controlling bit line select/deselect, where a bit line "select" implies the initiation of a memory access (read or write) and a bit line "deselect" implies the initiation of memory standby mode. These same concepts are applicable to the exemplary memory system in which the principals of the invention will be described hereinafter. The Marcello et al publication is hereby incorporated by reference.

U.S. Pat. No 4,555,776, to Masenas, Jr., issued Nov. 26, 1985 and U.S. Pat. No. 4,158,237, to Weidmann, issued in June 1979, show examples of high density ram cells organized in a columnar fashion with each cell attached to a pair of bit lines. It is within this same architectural context that an illustrative embodiment of the invention will be described hereinafter.

U.S. Pat. No. 4,555,776 to Masenas, Jr., also teaches the use of a voltage balancing circuit in a memory system for the purpose of balancing a pair of bit lines. According to this reference, the balancing function is partially accomplished by utilizing saturated transistors. The balancing is required since back injection occurs from the bit line into the memory cell during standby.

The saturated transistors in the bit line driver taught by Masenas, Jr., only partially equalize the bit line voltages to help achieve stability. The balancing is necessary in such memory systems to operate properly in the standby mode so that stored data is not disturbed by back injection. Furthermore, as will be appreciated by those skilled in the art, balanced bit line voltages are desirable to improve memory performance in the access (for example, "read") mode.

However, the circuitry taught by in the 4,555,776 patent can not be used to achieve high performance reads since the saturated transistors used to achieve the aforementioned partial balance operate very slowly.

U.S. Pat. No. 4,455,625, to Denis et al, issued Jun. 19, 1984, teaches an alternate solution to the problem of minimizing back injection and performing voltage balancing (in a memory system) between a pair of bit lines.

The Denis et al reference principally relates to an improved information storage device, in particular an active electronic memory cell of the type having a pair of transistors cross-coupled to form a flip-flop, which exhibits improved switching speed with reduced area and power requirements when compared to memories taught, for example, by Weidmann in U.S. Pat. No. 3,815,106 and Nakano, in U.S. Pat. No. 4,081,697.

In the context of teaching their invention, Denis et al teach the prior use of complementary transistor switch (CTS) memory cells in which PNP and NPN devices simultaneously drive and act as a load for one another. In particular, FIG. 2 of the reference shows a memory cell that uses a pair of PNP loads and a pair of Schottky barrier diodes to improve the operating characteristics of the memory system, as opposed to the aforementioned use of saturated transistors.

However, for density and stability reasons, the Schottky barrier diodes (depicted in FIG. 2 of the CTS memory cell described as prior art in the Denis et al reference), are often removed creating, once again, an excessive bit line offset and the back injection problem referred to hereinbefore.

U.S. Pat. No. 4,780,850, to Miyamoto et al, issued Oct. 25, 1988, and U.S. Pat. No. 4,760,561, to Yamamoto et al, issued Jul. 26, 1988, both teach random access memory systems in which bit line equalization is performed by precharging the bit lines prior to a memory read. The bit line balancing processes described by these references are very slow and are not useful in solving the bit line balance problem when the memory is in a standby mode.

Finally, U.S. Pat. No. 4,302,823 teaches a bit line driver utilizing a cross coupled pair of transistors; however the circuitry taught by the reference is for the purpose of achieving bit line unbalance to amplify the sense signal.

In view of the state of the art as exemplified by the aforementioned references, it would be desirable to be able to provide memory system circuitry which enables fast memory access to be achieved, while at the same time minimizing the potential for back injection disturbance of stored data while the memory system is in a standby mode.

From a technical point of view, with reference to Harper/PNP arrays and the illustrative columnar memory cell structure referred to hereinabove, it would be desirable to solve the problem of keeping the left and right bit lines associated with each column of a memory system to approximately the same potential during deselect. Solving this problem would enhance memory system performance during deselect by minimizing the potential for disturbance of stored data and facilitate improved memory access.

Furthermore, it would be desirable to overcome the effects of memory system bit line offset caused, for example, by uneven bit line patterns stored, for example, in a column of memory cells, to not only improve memory system performance; but to also allow for the extension of bit lines and bit line loading to accommodate larger arrays.

SUMMARY OF THE INVENTION

Thus, it is an object of the invention to provide means for eliminating the bit line voltage offset between a pair of (for example, left and right) bit lines in a memory system following deselect (i.e., when in standby mode) to facilitate an increase in memory system access performance once, for example, a read access is selected.

It is a further object of the invention to provide balanced pull up circuitry for eliminating the bit line voltage offset between the aforementioned bit line pair to reduce the potential for back injection disturbance of stored data while the memory system is in a standby mode.

Furthermore, it is an object of the invention to provide memory system circuitry which enables fast memory access to be achieved, while simultaneously minimizing the potential for back injection disturbance of stored data while the memory system is in a standby mode.

Still further, it is an object of the invention to provide means for facilitating extension of bit lines and bit line loading in the aforementioned memory systems to accommodate the fabrication of larger arrays without subjecting stored data to back injection instability caused, for example, by uneven bit patterns stored in the memory.

Further yet, it is an object of the invention to provide means for facilitating extension of bit lines and bit line loading in the aforementioned memory systems to accommodate the fabrication of larger arrays without significantly impacting the access performance of the extended array structure.

According to one aspect of the invention, the aforestated objectives may be achieved utilizing a balancing circuit for eliminating bit line voltage offset between a bit line pair in a memory system during memory deselect, wherein said balancing circuit is associated with a bit line driver and a plurality of memory cells coupled to said bit line pair in said memory system and comprises: (a) a first cascaded emitter follower circuit including first damping means; (b) a second cascaded emitter follower circuit including second damping means; (c) means for coupling said first and second cascaded emitter follower circuits; and (d) control means, for enabling and disabling said balancing circuit.

The problems alluded to with respect to the prior art systems discussed hereinbefore are solved by the novel balancing circuit since, regardless of the back injection, the circuit tends to eliminate the bit line voltage offset between the pair of bit lines during standby mode. The details of the novel circuits operation will be set forth hereinafter.

The balancing circuit contemplated by the invention features the ability to achieve an increase in memory system access performance since there is less bit line offset to overcome, while at the same time minimizing the potential for back injection disturbance of stored data while the memory system is in a standby mode.

Furthermore, the balancing circuit contemplated by the invention, in addition to simultaneously overcoming the effects of memory system bit line offset to improve the stability and performance of memory systems, also allows for the extension of bit lines and bit line loading to accommodate large memory arrays and memory array expansion.

These and other objects and features of the present invention and the manner of obtaining them will become apparent to those skilled in the art, and the invention itself will be best understood by reference to the following detailed description read in conjunction with the accompanying Drawings.

DETAILED DESCRIPTION

Figure 1:
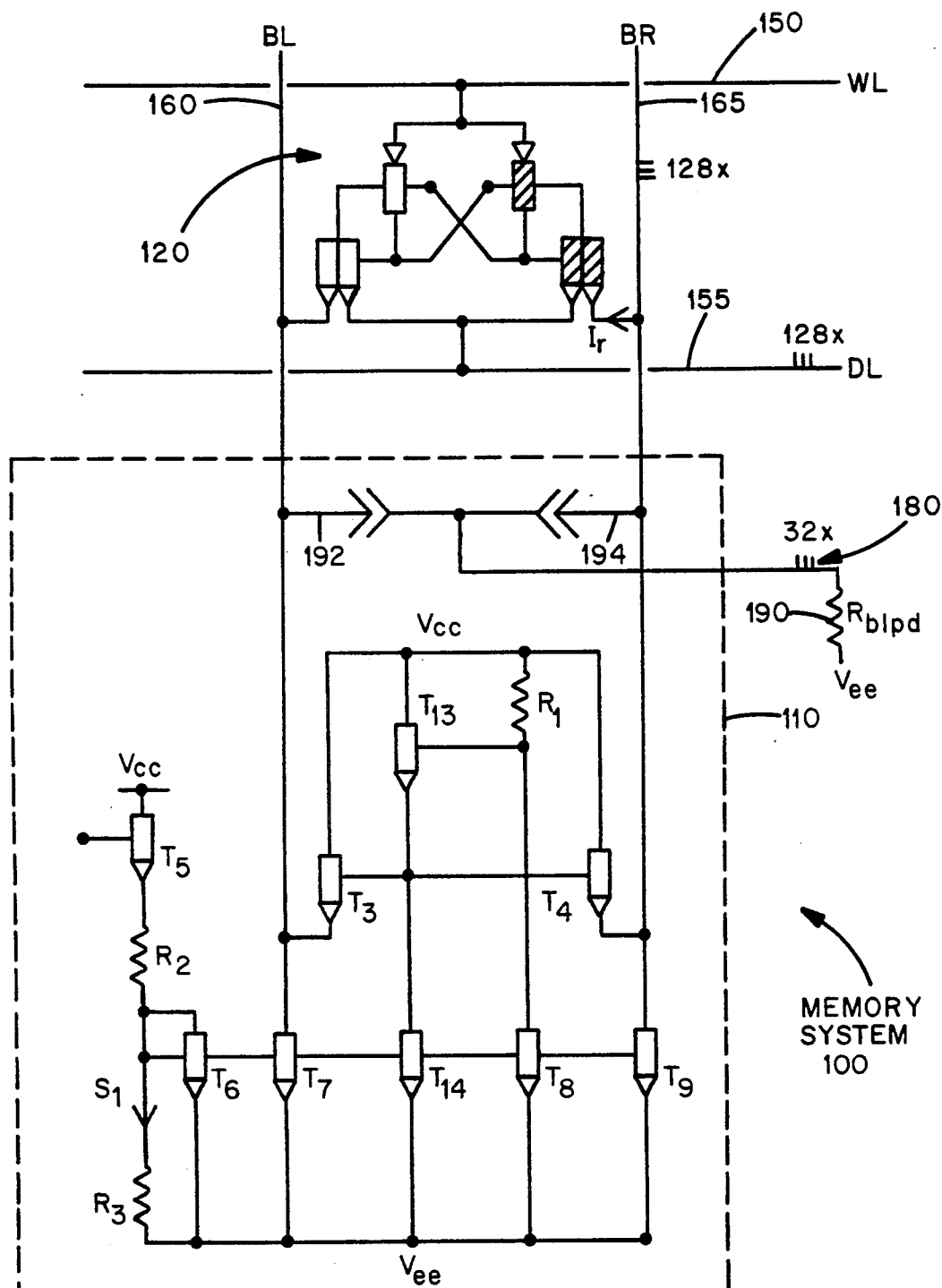
FIG. 1 of the Drawing depicts a portion of a prior art random access memory system, showing the details of a bit line driver that includes a pair of emitter followers which are used to provide varying bit line currents and to set standby bit line voltage levels to approximately $V_{cc}-2V_{be}$.

As indicated hereinabove, FIG. 1 depicts a portion of a prior art random access memory system (memory system 100), showing the details of a portion of an illustrative bit line driver (bit line driver 110), that includes a pair of emitter followers ($T_3$ and $T_4$) which are used to provide varying bit line currents and to set standby bit line voltage levels to approximately $V_{cc}-2V_{be}$.

FIG. 1 also depicts an exemplary memory cell (memory cell 120) in an array of, for example, 128 cells; word line (WL) 150 and drain line (DL) 155, to which memory cell 120 is coupled; and left bit line (BL) 160 together with right bit line (BR) 165, to which both memory cell 120 (along with another 127 memory cells not shown) and bit line driver 110 are coupled.

Illustrative memory cell 120 is a standard (commercially available) emitter coupled cell with a PNP load. When storing data in the right hand portion of the cell (as depicted by the shaded portion of FIG. 1), the cell experiences back injection current Ir as shown at 175, when the memory is in a standby mode.

FIG. 1 also shows a pull down resistor, 190, associated with bit line driver circuit 110, for providing, as is well known in prior art memory systems, standby pull down currents (through depicted Shottkey barrier diodes 192 and 194) to bit lines 160 and 165. The control lines shown at 180 indicate that illustrative pull down resistor 190 may be used to control 32 columns of memory cells, which is a common memory system design.

Bit line driver 110 depicted in FIG. 1 is also a well know commercially available device. The other components explicitly depicted in FIG. 1 (portions of bit line driver 110) include $R_1$, $T_{13}$, $T_{14}$, $T_5$-$T_9$, $R_2$, $R_3$ and $S_1$, which provide the control for bit line selection (select or deselect) in the manner described in IBM Technical Disclosure Bulletin Volume 24, No. 1B, previously incorporated herein by reference.

As indicated hereinabove, in known random access memories, such as those used in the commercially available IBM System 3090, saturated Harper/PNP memory cell arrays are always coupled to the bit lines and the standby bit line currents are sensitive functions of the bit pattern along the column.

Also, as indicated hereinbefore, in the present IBM 3090 design, a pair of emitter followers, such as $T_3$ and $T_4$ as depicted in FIG. 1, may be used to provide the varying bit line currents and to set the standby bit line voltage levels to approximately $V_{cc}-2Vbe$. To save power, the bit line standby current is set to under 100 ua, while the memory cell back injection current can reach 1 ma if 128 or more cells are loaded on the bit lines.

As a result, the voltage levels of the two sides (across BL 160 and BR 165) can differ by over 100 mv, because of the difference in Vbe's and the IR drop through the emitter resistance of the pull up transistors ($T_3$ and $T_4$ as shown in FIG. 1). This large bit line voltage offset severely limits the array performance and the possible extension of bit line loading for redundancy or for higher density applications.

The aforementioned offset can be reduced if bit line standby current is increased over ten times or if the pull up emitter followers $T_3$ and $T_4$ are made extremely large. However, as previously stated, power and area limitations, in addition to the problems associated with such increases in power and/or area, make such designs impractical.

Figure 2:
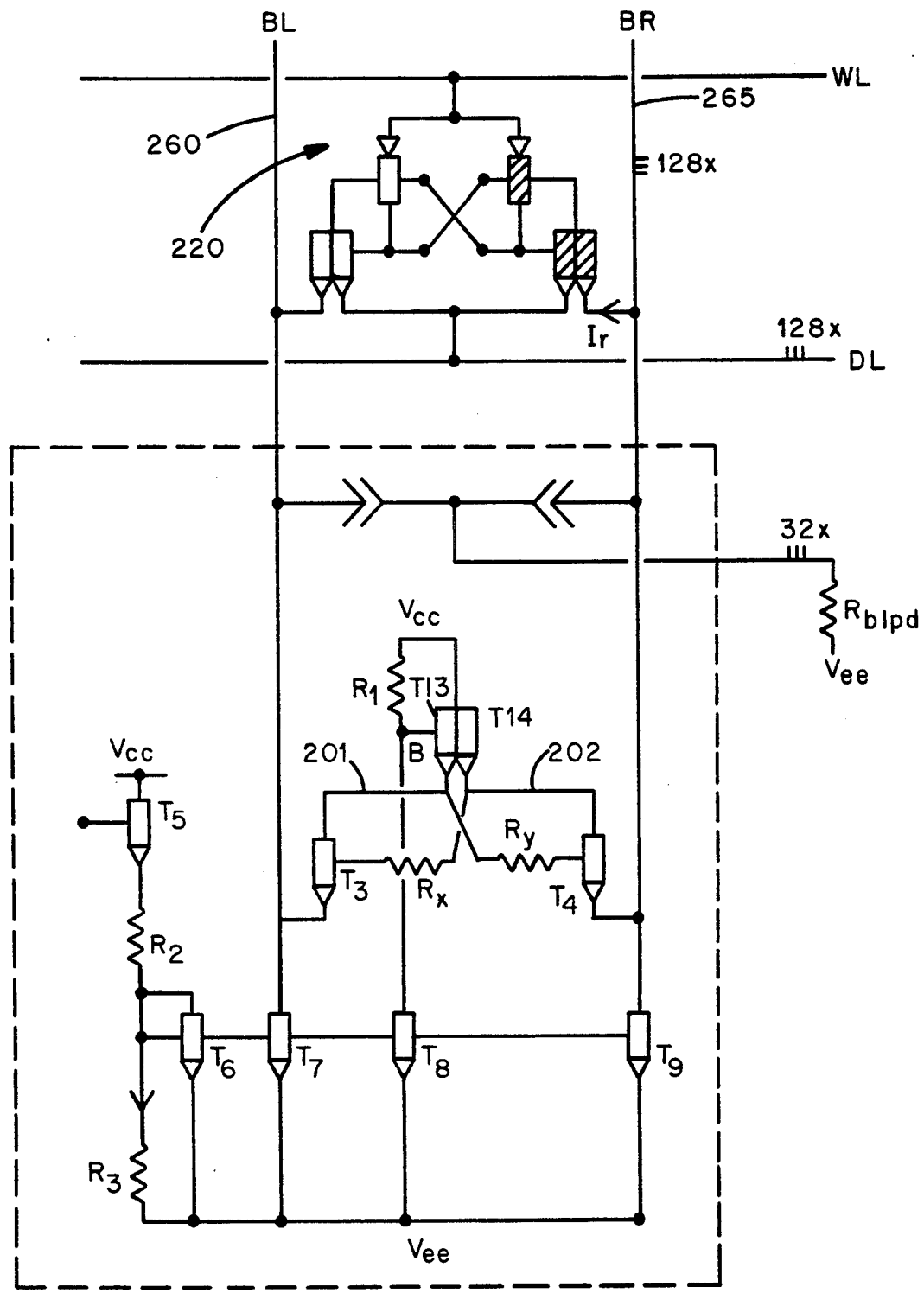
FIG. 2 of the Drawing depicts a portion of a random access memory system that includes an illustrative embodiment of the balancing circuitry contemplated by the invention. The balancing circuitry is shown included in the bit line driver circuit attached to a column of memory cells via the bit line pair being balanced.

Reference should now be made to FIG. 2 which depicts a portion of a random access memory system that includes an illustrative embodiment of the balancing circuitry contemplated by the invention. The balancing circuitry is shown included in bit line driver circuit 210 attached to a column of memory cells via the bit line pair (shown at 260 and 265 of FIG. 2) being balanced.

More particularly, according to the illustrative embodiment of the invention, all of the circuitry shown in FIG. 2 is the same as shown in FIG. 1 except for (1) the addition of resistors $R_x$ and $R_y$; and (2) the depicted rearrangement of $R_1$, $T_3$, $T_4$, $T_{13}$ and $T_{14}$. The balanced bit line pull up circuit depicted in FIG. 2 will tend to eliminate the offset for high density memory arrays.

In the circuit depicted in FIG. 2, $T_3$, $T_4$, $T_{13}$ and $T_{14}$ are intended to be identical transistors. If, for example, all the memory cells in a given column are "ON" on the right side (as indicated by the shaded area of memory cell 220), then $T_4$ has to supply all the cell back injection currents while $T_3$ only supplies a negligible bit line standby current.

Since the $T_4$ current is sourced from $V_{cc}$ through $T_{14}$; $V_{be}(T_4)$ is approximately equal to $V_{be}(T_{14})$. Similarly $V_{be}(T_3)$ is approximately equal to $V_{be}(T_{13})$. Thus the standby voltage levels of bit lines 260 and 265, V(bit line 260) and V(bit line 265) are about the same, regardless of the bit pattern, since:

$$\text{V(bit line 260)} \times V_{cc}-[V_{be}(T_{14})+V_{be}(T_3)] \text{ and}$$

$$\text{V(bit line 265)} \times V_{cc}-[V_{be}(T_{13})+V_{be}(T_4)[.$$

$R_x$ and $R_y$ are used to damp any possible oscillations during bit line deselect.

In other words, FIG. 2 depicts a balancing circuit for eliminating bit line voltage offset between a bit line pair in a memory system during memory deselect, wherein the balancing circuit is associated with a bit line driver and a plurality of memory cells coupled to the aforementioned bit line pair in said memory system, comprising: (a) a firs t cascaded emitter follower circuit ($T_{13}$, $T_4$) including first damping means ($R_y$); (b) a second cascaded emitter follower circuit ($T_{14}$, $T_3$) including second damping means ($R_x$); (c) means for coupling the first and second cascaded emitter follower circuits (201, 202); and (d) control means ($R_1$), for enabling and disabling the novel balancing circuit.

The control means, $R_1$, is operative to activate the balancing circuit when the memory system is in a standby condition and is further operative to deactivate the balancing circuit when any of the plurality of memory cells associated with a given bit line pair are selected for a memory access.

The control means depicted in FIG. 2 include pull up resistor $R_1$ coupled to a switchable current source $T_8$, with pull up resistor $R_1$ also coupled between Vcc and the base (shown at "B" in FIG. 2) of the lead transistors of each of the first and second cascaded emitter follower circuits.

Again, as indicated hereinabove, the advantages of the invention may be realized by rearranging the components of FIG. 1 as shown in FIG. 2, with the addition of only the extra damping resistors, $R_x$, $R_y$.

Without intending to limit the invention and for the purpose of presenting a working illustrative embodiment, the following values may be assigned to the components depicted in FIG. 2: if $R_1 \times 640$ ohms, then suitable values for $R_x$ and $R_y$ would be 470 ohms each; $R_2 \times 300$ ohms; $R_3 \times 500$ ohms; and the only other operative condition is that $T_3$, $T_4$, $T_{13}$ and $T_{14}$ must be the same. In accordance with the illustrative example being presented herein, it is contemplated that $V_{cc} \times 1.4$ volts and that $V_{cc} \times -2.2$ volts.

Figure 3:
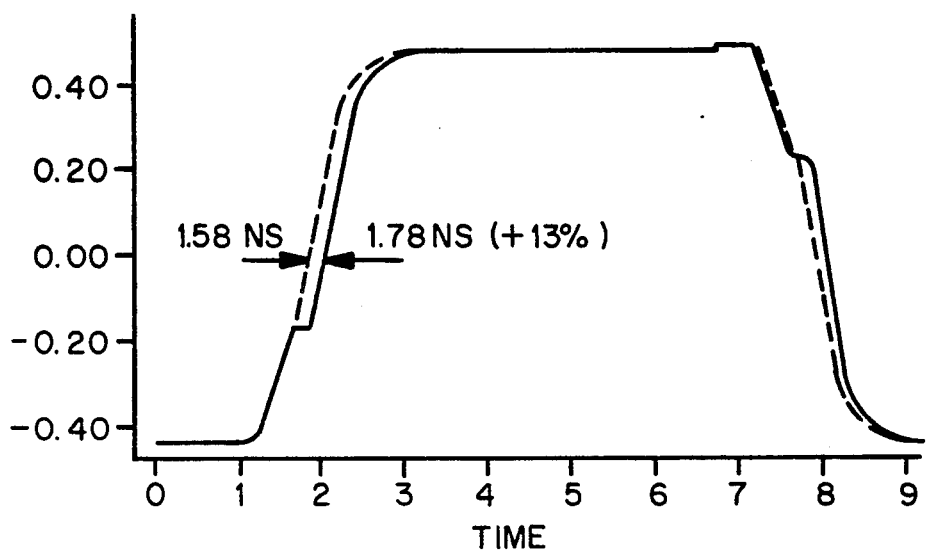
FIG. 3 of the Drawing is a chart comparing the performance of the memory system depicted in FIG. 1 with the memory system depicted in FIG. 2, assuming a 128K cache design, where 128 memory cells are loaded onto each bit line.
Figure 4:
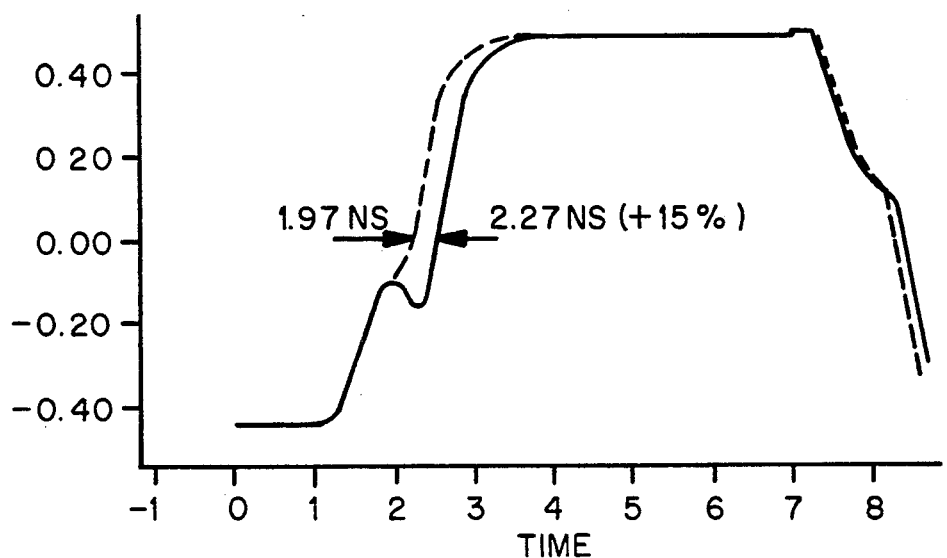
FIG. 4 of the Drawing is a chart comparing the performance of the memory depicted in FIG. 1 with the memory depicted in FIG. 2, assuming a 256K cache design, where 256 memory cells are loaded onto each bit line.

Reference should now be made to FIGS. 3 and 4 of the Drawing.

FIG. 3 of the Drawing, as indicated hereinbefore, is a chart comparing the performance of the memory system depicted in FIG. 1 with the memory system depicted in FIG. 2, assuming a 128K cache design, where 128 memory cells are loaded onto each bit line.

FIG. 4 of the Drawing, as indicated hereinbefore, is a chart comparing the performance of the memory depicted in FIG. 1 with the memory depicted in FIG. 2, assuming a 256K cache design, where 256 memory cells are loaded onto each bit line.

For a 128K cache memory, where 128 memory cells are loaded along each of the bit lines, the circuit contemplated by the invention provides a performance gain of about 13% as shown in FIG. 3.

If the 128K memory architecture is doubled to 256K, with 256 cells loaded along each of the bit lines, the new circuitry contemplated by the invention provides a performance gain of about 15% as shown in FIG. 4.

What has been described in detail hereinabove are methods and apparatus meeting all of the aforestated objectives. As previously indicated, those skilled in the art will recognize that the foregoing description has been presented for the sake of illustration and description only. It is not intended to be exhaustive or to limit the invention to the precise from disclosed, and obviously many modifications and variations are possible in light of the above teaching.

The embodiments and examples set forth herein were presented in order to best explain the principles of the instant invention and its practical application to thereby enable others skilled in the art to best utilize the instant invention in various embodiments and with various modifications as are suited to the particular use contemplated.

It is, therefore, to be understood that the claims appended hereto are intended to cover all such modifications and variations which fall within the true scope and spirit of the invention.

What is claimed is:

1. A balancing circuit for eliminating bit line voltage offset between a bit line pair in a memory system during memory deselect, wherein said balancing circuit is associated with a bit line driver and a plurality of memory cells coupled to said bit line pair in said memory system, comprising:
   (a) a first cascaded emitter follower circuit ($T_{13}$, $T_4$) including first damping means ($R_y$);
   (b) a second cascaded emitter follower circuit ($T_{14}$, $T_3$) including second damping means ($R_x$);
   (c) means for coupling said first and second cascaded emitter follower circuits (201, 202); and
   (d) control means ($R_1$), for enabling and disabling said balancing circuit.

2. Apparatus as set forth in claim 1 wherein said control means is operative to activate the said balancing circuit when the memory system is in a standby condition.

3. Apparatus as set forth in claim 1 wherein said control means is operative to deactivate the said balancing circuit when any of said plurality of memory cells associated with said bit line pair are selected for a memory access.

4. Apparatus as set forth in claim 1 wherein said first and second damping means are resistors.

5. Apparatus as set forth in claim 1 wherein said control means further comprises a pull up resistor ($R_1$) coupled to a switchable current source ($T_8$), and further wherein said pull up resistor is coupled between Vcc and the base of the lead transistors of each of said first and second cascaded emitter follower circuits.

6. A random access memory bit line pair balancing circuit, for eliminating the offset between a pair of bit lines to which a plurality of memory cells and a bit line driver are coupled in a random access memory system, comprising:
   (a) a first transistor pair ($T_{13}$, $T_{14}$) having a common control terminal (B), a common first conduction terminal tied to a first voltage reference ($V_{cc}$), and a pair of second conduction terminals;
   (b) said $V_{cc}$ connected to said common first conduction terminal;
   (c) control means ($R_1$) connected between said first voltage reference and said common control terminal; and
   (d) a pair of balancing transistors ($T_3$, $T_4$), wherein each of said balancing transistors has a resistor ($R_x$, $R_y$) connected between a control terminal and a first conduction terminal of the other transistor of said pair of balancing transistors.

7. Apparatus as set forth in claim 6 wherein one of each of said second conduction terminals of said first transistor pair is connected to one of said first control terminals of said pair of balancing transistors.

8. Apparatus as set forth in claim 7 wherein a second conduction terminal of each of said balancing transistors is connected to one of the bit lines of said pair of bit lines.

9. Apparatus as set forth in claim 6 wherein said control means is a resistor ($R_1$).

10. A high performance memory system, capable of protecting stored data from back injection current in standby mode and facilitating rapid memory access, comprising:
   (a) a plurality of memory cells coupled to a bit line pair;
   (b) a bit line driver, coupled to said bit line pair, for controlling the selection and deselection of the memory cells coupled to said bit line pair; and
   (c) balancing circuitry for eliminating bit line voltage offset between the bit lines of said bit line pair during memory deselect, to thereby minimize said back injection current, said balancing circuitry further comprises:
   a first cascaded emitter follower circuit ($T_{13}$, $T_4$) including first damping means ($R_y$),
   a second cascaded emitter follower circuit ($T_{14}$, $T_3$) including second damping means ($R_x$),
   means for coupling said first and second cascaded emitter follower circuits (201, 202), and
   control means ($R_1$), for enabling and disabling said balancing circuitry.

* * * * *

UNITED STATES PATENT AND TRADEMARK OFFICE
CERTIFICATE OF CORRECTION

PATENT NO. : 5,297,089
DATED : March 22, 1994
INVENTOR(S) : Robert C. Wong

It is certified that error appears in the above-identified patent and that said Letters Patent is hereby corrected as shown below:

In Column 6, line 64, please delete "$R_1X640$"
and insert --$R_1=640$--.

In Column 6, line 66, please delete "$R_2X300$ ohms; $R_2X500$"
and insert -- $R_2=300$ ohms ; $R_3=500$ ohms --.

In Column 7, line 1, please delete "$V_{cc}X1.4$"
and insert --Vcc=1.4--.

In Column 7, line 2, please delete "$V_{cc}X-2.2$"
and insert -- $V_{ee}=-2.2$ volts --.

Signed and Sealed this

Twenty-fourth Day of January, 1995

Attest:

BRUCE LEHMAN

*Attesting Officer*   *Commissioner of Patents and Trademarks*